United States Patent [19]
Jung

[11] Patent Number: 5,729,496
[45] Date of Patent: Mar. 17, 1998

[54] NONVOLATILE SEMICONDUCTOR MEMORY ELEMENT AND METHOD FOR FABRICATING THE SAME

[75] Inventor: Won Young Jung, Seoul, Rep. of Korea

[73] Assignee: LG Semicon Co., Ltd., Chungcheongbuk-do, Rep. of Korea

[21] Appl. No.: 698,247

[22] Filed: Aug. 15, 1996

Related U.S. Application Data

[62] Division of Ser. No. 418,283, Apr. 7, 1995, Pat. No. 5,583,066.

[30] Foreign Application Priority Data

Jul. 30, 1994 [KR] Rep. of Korea ............... 18891/1994

[51] Int. Cl.⁶ .................................................. G11C 13/00
[52] U.S. Cl. ..................... 365/185.26; 257/315; 257/321
[58] Field of Search ..................... 365/185.26, 185.01, 365/185.1; 257/315, 321

[56] References Cited

U.S. PATENT DOCUMENTS

| | | | |
|---|---|---|---|
| 5,391,508 | 2/1995 | Matsuoka et al. | 437/41 |
| 5,424,567 | 6/1995 | Chen | 257/315 |
| 5,440,158 | 8/1995 | Sung-Mu | 257/315 X |
| 5,459,091 | 10/1995 | Hwang | 437/43 |
| 5,460,988 | 10/1995 | Hong | 257/315 X |
| 5,480,820 | 1/1996 | Roth et al. | 437/43 |
| 5,496,753 | 3/1996 | Sakurai et al. | 437/43 |

OTHER PUBLICATIONS

Fuijo Masuoka, "Technology Trend of Flash—EEPROM—Can Flash-EEPROM overcom DRAM?", 1992 Symposium on VLSI Technology Digest of Technical Papers, Jun. 2–4, 1992, Seattle, WA.

*Primary Examiner*—Do Hyun Yoo
*Attorney, Agent, or Firm*—Finnegan, Henderson, Farabow, Garrett & Dunner, L.L.P.

[57] ABSTRACT

This invention relates to a nonvolatile semiconductor memory element having elevated source and drain regions, a well-shaped floating gate surrounding a control gate, and leveled surface, and a method for fabricating the same. The nonvolatile semiconductor memory element includes a first conduction type substrate having a channel region, an elevated source and drain regions of second conduction type formed to have a step on the substrate separated by the channel region, a floating gate insulation film formed on exposed surfaces of the substrate corresponding to the channel region and the source and drain regions, as well-shaped floating gate formed on the floating gate insulation film on the channel region having a fixed depth and a fixed thickness, a control gate having a fixed thickness formed fully buried in the well of the floating gate so that the floating gate can surround the control gate, and an interlayer insulation film formed between the floating gate and the control gate so as to insulate the floating gate and the control gate.

8 Claims, 3 Drawing Sheets

NONVOLATILE SEMICONDUCTOR MEMORY ELEMENT AND METHOD FOR FABRICATING THE SAME

This is a division of application Ser. No. 08/418,283, filed Apr. 7, 1995 now U.S. Pat. No. 5,583,066.

BACKGROUND OF THE INVENTION

This invention relates to a nonvolatile semiconductor memory element, more particularly to an EEPROM (Electrically Erasable and Programmable Read Only Memory) having elevated source and drain regions formed to have a step on a substrate.

DISCUSSION OF THE RELATED ART

An EEPROM cell as shown in FIG. 1 includes channel region 19 defined in a substrate 11 by forming n+ type source and drain regions 12 and 13 within a p type silicon substrate 11.

Floating gate insulation film 14 is formed On the substrate 11 and includes tunneling oxide film 15. Tunneling oxide film 15 is thinner over drain region 13 permitting charges to tunnel from drain region 13 when a strong electric field is established between drain region 13 and a gate during a writing operation.

Floating gate 16 is formed on floating gate insulation film 14 to store charges tunneled from drain region 13 through tunneling oxide film 15 during a writing operation. The EEPROM also includes interlayer insulation film 17, formed from a dielectric film, on floating gate 16 and control gate 18 formed on interlayer insulation film 17. Both floating gate 16 and control gate 18 are polysilicon films.

The EEPROM element described above, allows both writing and erasing.

During writing, i.e., programming, a relatively high voltage is applied to control gate 18 through voltage application terminal Vg while drain region 13 is maintained at ground voltage through voltage application terminal Vd. Hot electrons flow from channel region 19 into drain region 13, and, due to a high electric field between control gate 18 and drain region 13, also tunnel into floating gate 16 through tunneling oxide film 15. The electrons which tunnel into floating gate 16 store charges. The tunneling of electrons from drain region 13 to the floating gate 16 through tunneling oxide film 15 is termed "Fowler-Nordheim tunneling".

Having floating gate 16 negatively charged by the tunneled electrons, prevents the channel region from being inverted even though normal operating voltages will be applied to control gate 18.

During erasing, control gate 18 is maintained at ground voltage and drain region 13 is maintained at a relatively high voltage applied through voltage application terminal Vd. The charge stored in floating gate 16 is thus discharged through tunnelling oxide film 15.

The relatively high writing voltage is approximately 12V, and the normal operating voltage is 5V, i.e., different voltages are used during writing and reading.

As described above, source region 12 is floated during writing and erasing, and the electrons are tunneled from floating gate 16 through tunneling oxide film 15.

Conventional EEPROM cells have integration limits due to relatively large cell size and delays in writing, i.e., information programming, which are several tens to hundreds times longer than a general DRAM cell.

Another problem occurs due to deposition of a polysilicon film control gate on a deposited polysilicon film floating gate when an uneven surface is created. Subsequently, a process for flattening steps on the substrate is required reducing the reliability of the wiring.

SUMMARY OF THE INVENTION

The present invention has been made in view of the above circumstances and has as an object to provide a nonvolatile semiconductor memory element which can improve integration by forming elevated source and drain regions.

Another object of this invention is to provide a nonvolatile semiconductor memory element which can improve erase time by widening an overlap area between a floating gate and a drain region.

Another object of this invention is to provide a method for fabricating a nonvolatile semiconductor memory element which eliminates a separate flattening process and solves problems of defective wiring due to steps by providing elevated source and drain regions without any outward step.

Still another object of this invention is to provide a method for fabricating a nonvolatile semiconductor memory element which simplifies processing by using an impurity doped polysilicon film for the source and drain regions which eliminates an ion injection process for forming separate source and drain regions.

Additional objects and advantages of the invention will be set forth in part in the description which follows and in part will be obvious from the description, or may be learned by practice of the invention. The objects and advantages of the invention may be realized and attained by means of the instrumentalities and combinations particularly pointed out in the appended claims.

To achieve the objects and in accordance with the purpose of the invention, as embodied and broadly described herein, the nonvolatile semiconductor memory element of this invention comprises a first conduction type substrate having a channel region, a second conduction type elevated source/drain regions formed to have a step on the substrate, a floating gate insulation film formed on exposed surfaces of the substrate corresponding to the channel region and the source/drain regions, a well-shaped floating gate formed on the floating gate insulation film on the channel region and having a depth as much as the step between the source/drain regions and the substrate and a constant thickness, an interlayer insulation film formed on inside surface of the floating gate, and a control gate formed on the interlayer insulation film so as to be buried in the floating gate, and by providing a method for fabricating a nonvolatile semiconductor memory element including processes for depositing an impurity doped polysilicon film on a first conduction type silicon substrate, patterning the impurity doped polysilicon film to define a channel region and form source/drain regions separated by the channel region, forming a floating gate insulation film on exposed surfaces of the substrate in the channel region and the source/drain regions, forming a well-shaped floating gate in the channel region by depositing and etching a polysilicon film on the floating gate insulation film, forming an interlayer insulation film on all over the substrate, and forming a control gate only within the well by depositing and etching a polysilicon film on the substrate.

BRIEF DESCRIPTION OF THE DRAWINGS

The accompanying drawings, which are incorporated in and constitute a part of this specification illustrate embodiments of the invention and, together with the description, serve to explain the objects, advantages and principles of the invention. In the drawings.

DETAILED DESCRIPTION OF THE INVENTION

Figure 1:
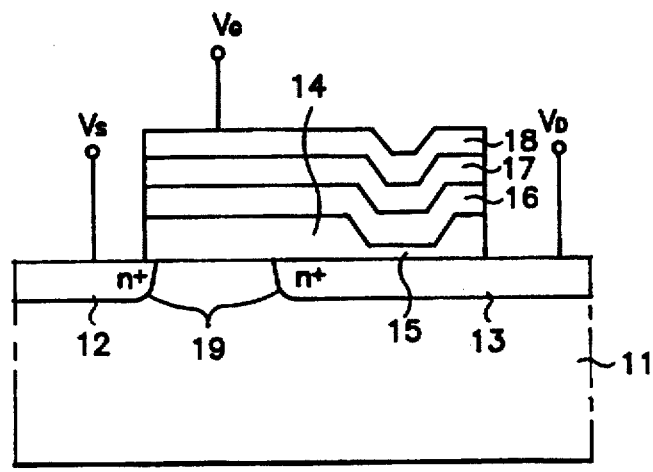
FIG. 1 is a section of a conventional nonvolatile semiconductor memory element.
Figure 2:
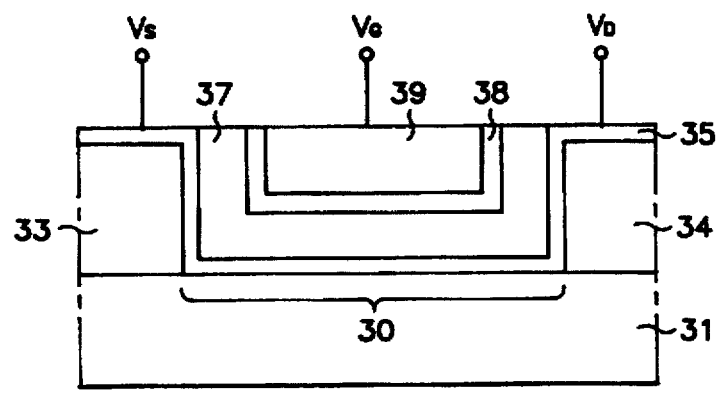
FIG. 2 is a section of a nonvolatile semiconductor memory element according to one embodiment of this invention.

FIG. 2 is a section of a nonvolatile semiconductor memory element according to a first embodiment of this invention.

Referring to FIG. 2, a nonvolatile semiconductor memory element, EEPROM, according to this invention, includes p type silicon substrate 31 having channel region 30, elevated source and drain regions 33 and 34 formed with a step on the substrate 31 and separated from each other by channel region 30, floating gate insulation film 35 formed on exposed surfaces of source and drain regions 33 and 34 and substrate 31 corresponding to channel region 30, well-shaped floating gate 37 formed only on floating gate insulation film 35 over channel region 30, interlayer insulation film 38 formed in the well of well-shaped floating gate 37 over substrate 31, and control gate 39 formed only on an inside surface of interlayer insulation film 38 filling the well of well-shaped floating gate 37.

Source and drain regions 33 and 34 are polysilicon films doped with n+ type impurities and having varying thicknesses depending on the desired overall characteristics of the elements.

In this invention, polysilicon films forming source and drain regions 33 and 34 have a thickness of 2000 to 3500 Å and an n type impurity density of $1\times10^{20}$ ions/cm$^2$.

Floating gate insulation film 35 is a tunneling oxide film having a thickness of 100 to 120 Å formed by thermal oxidation.

The thickness of floating gate insulation film 35 is determined depending on the bias applied to control gate 39 during writing and to drain region 34 during erasing.

Well-shaped floating gate 37 is formed of a polysilicon film having a uniform thickness of 1000 Å to 1500 Å. The well depth of well-shaped floating gate 37 is smaller than the step between substrate 31 and source and drain regions 33 and 34.

Because source and drain regions 33 and 34 and well-shaped floating gate 37 are formed above substrate 31, an overlap area between well-shaped floating gate 37 and drain region 34 can be increased shortening erase time.

Interlayer insulation film 38 is a dielectric film having a thickness of 400 Å to 600 Å and can be formed using deposition or thermal oxidation.

Control gate 39 is in the shape of a polysilicon stud and is buried in the well of well-shaped floating gate 37. Because well-shaped floating gate 37 fully surrounds control gate 39, erase time is further shortened.

The EEPROM does not require any additional film for flattening because elevated source and drain regions 33 and 34 of a polysilicon film prevents a reduction of channel length and makes an element having a level surface.

FIGS. 3(a) to 3(g) show steps for fabricating an EEPROM in accordance with this invention.

Figure 3A:
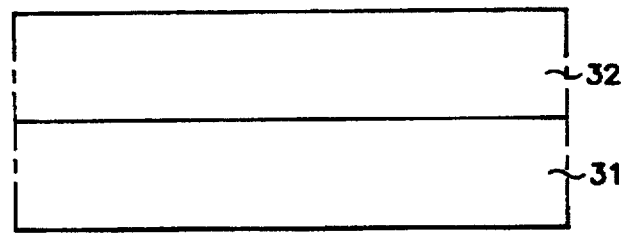
FIGS. 3(a) to 3(g) show process steps for fabricating a nonvolatile semiconductor memory element shown in FIG. 2.

First, source and drain regions 33 and 34 are formed by depositing an n+ type doped polysilicon film 32 to a thickness of 2000 Å to 3500 Å on a p type substrate 31 as illustrated in FIG. 3(a).

The n+ type doped polysilicon film 32 has a thickness determined according to desired overall characteristics of the element and a doped impurity density of $1\times10^{20}$ ions/cm$^2$.

Figure 3B:
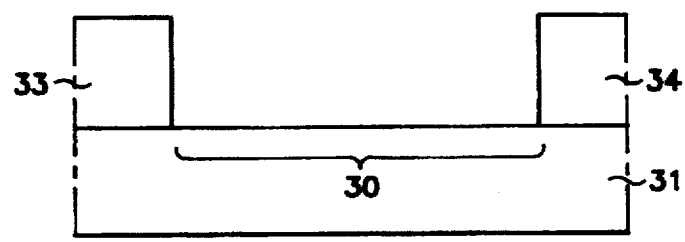

Source and drain region 33 and 34 are formed by etching n+ type doped polysilicon film 32 as illustrated in FIG. 3(b). Exposed silicon substrate 31 between source and drain regions 33 and 34 defines channel region 30.

Ion injection or depletion ion injection after forming the source and drain regions 33 and 34, adjusts threshold voltage as required.

Figure 3C:
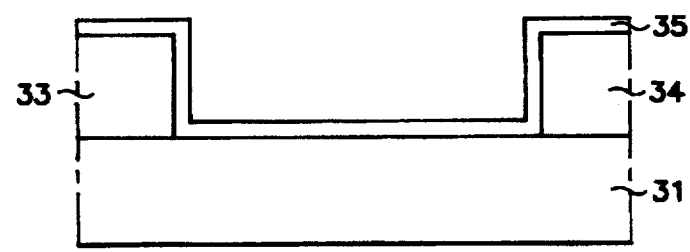
Figure 3D:
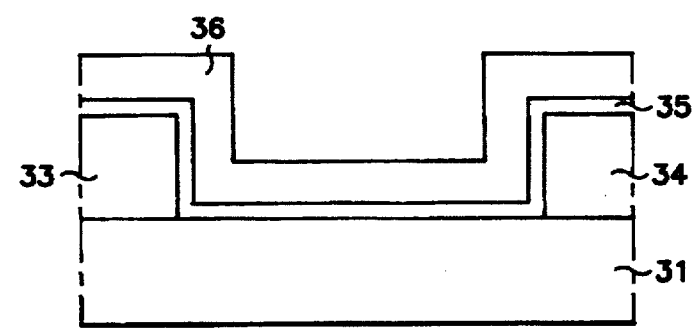

Exposed surfaces of the source and drain regions 33 and 34 as well as the exposed silicon substrate corresponding to channel region 30 are oxidized using a thermal oxidation to form tunneling oxide film 35 having a thickness of 100 Å to 120 Å as illustrated in FIG. 3(c).

Tunneling oxide film 35 is a floating gate insulation film having a thickness determined according to applied biases to control gate 18 during writing and to drain region 13 during erasing.

Polysilicon film 36, of a thickness of 1000 Å to 1500 Å, is then formed on floating gate insulation film 35 as illustrated in FIG. 3(a).

Figure 3E:
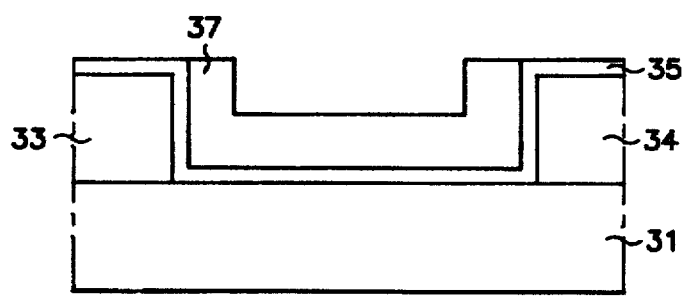

Well-shaped floating gate 37 is formed over channel region 30 by removing polysilicon film 36 over source and drain regions 33 and 34 by etching deposited polysilicon film 36 until floating gate insulation film 35 is exposed as illustrated in FIG. 3(e).

The depth of well-shaped floating gate 37 is smaller than the step between substrate 31 and the elevated source and drain regions 33 and 34.

Figure 3F:
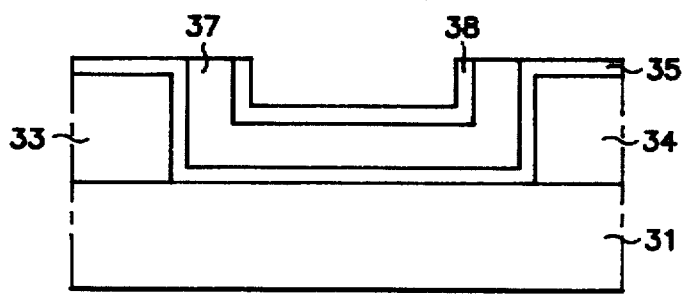

Interlayer insulation film 38 between control gate 39 and well-shaped floating gate 36 has a thickness of 400 Å to 600 Å and is formed by thermally oxidizing the exposed surfaces of well-shaped floating gate 37 and the floating gate insulation film 35 as illustrated in FIG. 3(f).

Interlayer film 38 can also be formed using deposition.

Figure 3G:
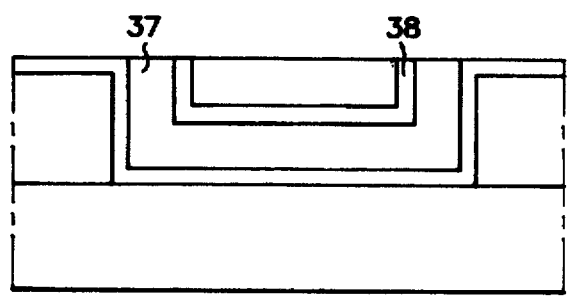

Control gate 39 is in a shape of a polysilicon stud and is formed by depositing a polysilicon film which fills well-shaped floating gate 36 and etching the polysilicon film as illustrated in FIG. 3(g).

Though not shown in the drawings, an insulation film may be deposited over the entire surface of an EEPROM having elevated source and drain regions while forming contact holes and providing wiring.

The EEPROM can be either fabricated on a p type silicon substrate 31 directly as described above or fabricated in a p type well formed on substrate 31.

According to this invention described herein, it is possible to increase integration greater than three times over conventional memory cells and to decrease erase time because of increasing the overlap between the well-floating gate and the drain region formed using elevated source and drain regions.

Further, fabrication processes are simplified and fabrication process control is made easier because the EEPROM of this invention has a level surface, which can improve step coverage, solves the problem of defective wiring, and eliminates the flattening or leveling process.

Moreover, fabrication processes are simplified and fabrication process control is made easier because an n+ type impurity doped polysilicon film is used for the source and drain regions eliminating an ion injection process for forming the source and drain regions.

The foregoing description of preferred embodiments of the invention has been presented for purposes of illustration and description. It is not intended to be exhaustive or to limit the invention to the precise form disclosed, and modifications and variations are possible in light of the above teachings or may be acquired from practice of the invention. The embodiments were chosen and described in order to explain the principles of the invention and its practical application to enable one skilled in the art to utilize the invention in various embodiments and with various modifications as are suited to the particular use contemplated. It is intended that the scope of the invention be defined by the claims appended hereto, and their equivalents.

What is claimed is:

1. A nonvolatile semiconductor memory element comprising:

a substrate of a first impurity type having a channel region;

elevated source and drain regions of a second impurity type formed above the substrate, the elevated source and drain regions separated by the channel region;

a floating gate insulation film formed on exposed surfaces of the substrate corresponding to the channel region and the source and drain regions;

a well-shaped floating gate formed on the floating gate insulation film, the well-shaped floating gate having a fixed depth and a fixed thickness;

a control gate formed within the well of the well-shaped floating gate, the control gate having a fixed thickness; and an interlayer insulation film formed between the well-shaped floating gate and the control gate insulating the well-shaped floating gate from the control gate.

2. The nonvolatile semiconductor memory element as claimed in claim 1, wherein each of the source and drain regions is a doped polysilicon film.

3. The nonvolatile semiconductor memory element as claimed in claim 1, wherein each of the well-shaped floating gate and the control gate is a polysilicon film.

4. The nonvolatile semiconductor memory element as claimed in claim 1, wherein the control gate has a shape of a polysilicon stud.

5. The nonvolatile semiconductor memory element as claimed in claim 1, wherein a top surface of the nonvolatile semiconductor memory element is level.

6. The nonvolatile semiconductor memory element as claimed in claim 1, wherein the floating gate insulation film is a tunneling oxide film having a thickness of 100 Å to 120 Å.

7. The nonvolatile semiconductor memory element as claimed in claim 1, wherein the floating gate insulation film is a thermal oxidation film.

8. The nonvolatile semiconductor memory element as claimed in claim 1, wherein the floating gate insulation film is a chemical vapor deposition oxidation film.

* * * * *